United States Patent
Hwang et al.

(10) Patent No.: US 7,629,589 B2
(45) Date of Patent: Dec. 8, 2009

(54) APPARATUS AND METHOD FOR CONTROLLING ION BEAM

(75) Inventors: Sung-Wook Hwang, Seoul (KR); Do-Haing Lee, Hwaseong-si (KR); Chul-Ho Shin, Yongin-si (KR); Jong-Woo Sun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 325 days.

(21) Appl. No.: 11/703,130

(22) Filed: Feb. 7, 2007

(65) Prior Publication Data

US 2007/0181820 A1    Aug. 9, 2007

(30) Foreign Application Priority Data

Feb. 7, 2006    (KR) .................. 10-2006-0011845

(51) Int. Cl.
*G21K 1/08*    (2006.01)
*H01J 1/36*    (2006.01)
*H01J 1/46*    (2006.01)

(52) U.S. Cl. .............. 250/396 R; 250/492.1; 250/492.2; 250/492.21; 250/492.3; 313/359.1; 313/360.1; 315/111.31; 315/111.61

(58) Field of Classification Search ......... 250/396 R, 250/504 R, 492.1, 492.2, 492.21, 492.22, 250/492.23, 492.3, 493.1, 423 R, 424, 423 P, 250/423 F, 396 ML; 204/164; 315/11.91, 315/111.41, 111.31, 7, 368.16, 37, 39.63, 315/43, 89, 111.21, 111.611; 313/359.1, 313/363.1, 360.1, 361.1
See application file for complete search history.

(56) References Cited

U.S. PATENT DOCUMENTS

| | | | | |
|---|---|---|---|---|
| 4,447,773 | A | * | 5/1984 | Aston ................. 313/360.1 |
| 5,504,340 | A | * | 4/1996 | Mizumura et al. ..... 250/492.21 |
| 5,841,235 | A | * | 11/1998 | Engelko et al. ....... 315/111.21 |
| 6,777,882 | B2 | * | 8/2004 | Goldberg et al. ...... 315/111.81 |
| 2003/0079983 | A1 | * | 5/2003 | Long et al. .............. 204/164 |
| 2005/0201246 | A1 | * | 9/2005 | Buschbeck et al. ........ 369/101 |
| 2005/0253089 | A1 | * | 11/2005 | Maeno et al. ........... 250/491.1 |
| 2006/0113489 | A1 | * | 6/2006 | Ray et al. ............ 250/492.21 |
| 2006/0284114 | A1 | * | 12/2006 | Olson et al. .......... 250/492.21 |

FOREIGN PATENT DOCUMENTS

| | | |
|---|---|---|
| JP | 06-306619 | 11/1994 |
| JP | 2003-086530 | 3/2003 |
| JP | 2003-132835 | 5/2003 |
| JP | 2005-174569 | 6/2005 |
| KR | 10-1999-0082851 | 11/1999 |
| KR | 10-2000-0053175 | 8/2000 |
| KR | 10-2003-0035946 | 5/2003 |
| KR | 10-2005-0011671 | 1/2005 |

* cited by examiner

*Primary Examiner*—Jack I Berman
*Assistant Examiner*—Nicole Ippolito Rausch
(74) *Attorney, Agent, or Firm*—Harness, Dickey & Pierce, PLC

(57) ABSTRACT

An apparatus and/or method for controlling an ion beam may be provided, and/or a method for preparing an extraction electrode for the same may be provided. In the apparatus, a plurality of extraction electrodes may be disposed in a path of an ion beam. At least one extraction electrode may include a plurality of sub-grids.

30 Claims, 5 Drawing Sheets

APPARATUS AND METHOD FOR CONTROLLING ION BEAM

PRIORITY STATEMENT

This U.S. non-provisional patent application claims the benefit of priority under 35 U.S.C. §119 to Korean Patent Application No. 10-2006-11845, filed on Feb. 7, 2006, the entire contents of which are hereby incorporated herein in their entirety by reference.

BACKGROUND

1. Field

Example embodiments relate to an apparatus for fabricating a semiconductor device, and for example, to an apparatus and/or a method for controlling an ion beam, and/or to a method for preparing an extraction electrode for the same.

2. Description of Related Art

An ion beam apparatus using a plasma as an ion source has been utilized in a processing apparatus for a semiconductor device. In the ion beam apparatus, a plurality of extraction electrodes in which a plurality of extraction holes may be formed may be disposed at an extraction terminal of the ion source. A voltage may be applied between the extraction electrodes to extract an ion beam from the ion source.

In a semiconductor process using an ion beam, the uniformity of the ion beam has a great effect on the uniformity of the semiconductor process. Accordingly, it may be very important to control the uniformity of the ion beam. Generally, a repulsive force between charged particles included in an ion beam may increase a divergence toward an edge of the ion beam, and a flux of the ion beam may decrease toward the edge. Because a density of a plasma for extracting the ion beam may decrease from a center of the plasma toward an edge of the plasma, the uniformity of the ion beam may decrease. A neutral beam generated from the ion beam may have the same uniformity as that of the ion beam.

FIG. 1 illustrates an ion beam apparatus 10 for obtaining a uniform ion beam I according to the conventional art. The ion beam apparatus 10 may include an ion source P including a plasma chamber 11. An extraction electrode 12 may have an extraction hole at an edge 12b of the plasma chamber 11 and/or an extraction hole at a center 12a of the plasma chamber 11. According to the conventional art, in order to increase the uniformity of the ion beam I, there is proposed a method to differentiate a diameter of the extraction hole at the edge 12b of the plasma chamber 11 from a diameter of the extraction hole at the center 12a of the plasma chamber 11. However, it may be difficult to fabricate an extraction electrode 12 with spatially different diameters for extraction holes. When spatial distribution of the ion beam I changes according to a change in a process condition, different extraction electrodes may need to be fabricated. Accordingly, a process window capable of changing a process condition may be considerably limited.

In conventional semiconductor devices, because a size of the extraction electrode has been increased according to an increase in a wafer size, the aforementioned method may increasingly have difficulty in controlling the uniformity of the ion beam.

SUMMARY

Example embodiments may provide an apparatus and/or a method for controlling an ion beam to increase the uniformity of an ion beam used in a semiconductor process. Example embodiments may provide a method for preparing an extraction electrode for controlling an ion beam.

Example embodiments may provide an apparatus for controlling an ion beam. The apparatus may include at least one extraction electrode disposed in a path of an ion beam. The at least one extraction electrode may include a plurality of sub-grids. Accordingly, a divergence of the ion beam may be easily controlled and/or the uniformity of the ion beam may be improved by controlling the ion beam corresponding to a position of the sub-grids.

According to an example embodiment, the at least one extraction electrode may include a plurality of extraction electrodes.

According to an example embodiment, the remainder of the plurality of extraction electrodes may be extraction electrodes including a plurality of sub-grids.

According to an example embodiment, the remainder of the plurality of extraction electrodes may be extraction electrodes without a plurality of sub-grids.

According to an example embodiment, some of the remainder of the plurality of extraction electrodes may include a plurality of sub-grids and some of the remainder of the plurality of extraction electrodes need not include a plurality of sub-grids.

According to an example embodiment, potentials may be applied to the plurality of sub-grids to control the ion beam. The potentials may be different potentials.

According to an example embodiment, the apparatus may further include an ion source for generating the ion beam, and the at least one extraction electrode may include a plurality of extraction holes through which the ion beam passes.

According to an example embodiment, the plurality of sub-grids may include a first sub-grid in the at least one extraction electrode and/or a second sub-grid located outside the first sub-grid and having a potential difference with respect to the first sub-grid. The first sub-grid may be located at a center of the at least one extraction electrode.

According to an example embodiment, the at least one extraction electrode including the plurality of sub-grids may be a first extraction electrode most adjacent to the ion source among the plurality of extraction electrodes. The at least one extraction electrode including the plurality of sub-grids may be a beam controlling extraction electrode.

According to an example embodiment, a ground potential may be applied to a final extraction electrode spaced farthest from the ion source.

According to an example embodiment, the beam controlling extraction electrode may be spaced from the first extraction electrode most adjacent to the ion source and/or may be located between the first extraction electrode and the final extraction electrode. A positive potential may be applied to the first extraction electrode and/or a negative potential may be applied to the beam controlling extraction electrode. Accordingly, flux distribution of the ion beam may be controlled to improve the uniformity of the ion beam.

According to an example embodiment the plurality of sub-grids may have a configuration reflecting a practical, or alternatively, an actual ion beam distribution.

According to an example embodiment, a method for controlling an ion beam may include applying a potential to at least one extraction electrode disposed in a path of an ion beam. The at least one extraction electrode may include a plurality of sub-grids.

According to an example embodiment, a method for controlling an ion beam may include applying different potentials to a plurality of extraction electrodes disposed in a path of an ion beam extracted from an ion source and having a plurality of extraction holes through which the ion beam passes; and dividing at least one extraction electrode among the extraction electrodes into a plurality of sub-grids and independently controlling potentials of the plurality of sub-grids. Accordingly, the ion beam may be controlled to make the distribution of the ion beam uniform. A controlled physical factor may be energy, a flux, or an irradiation angle of the ion beam.

According to an example embodiment, the method may further include independently controlling potentials of the plurality of sub-grids.

According to an example embodiment, the potentials applied to the plurality of extraction electrodes may be different potentials. The ion beam may be extracted from an ion source. The plurality of extraction electrodes may have a plurality of extraction holes through which the ion beam passes.

According to an example embodiment, a method for preparing an extraction electrode may include measuring a distribution of an ion beam and/or forming an extraction electrode having a plurality of sub-grids having a configuration reflecting the distribution of the ion beam.

According to an example embodiment, measuring the distribution of the ion beam may measure a two-dimensional distribution of the ion beam on a semiconductor substrate. Forming the extraction electrode may further include dividing the semiconductor substrate into a plurality of regions having a two-dimensional configuration reflecting the two-dimensional distribution of the ion beam and/or forming the plurality of sub-grids to correspond to the plurality of regions.

According to an example embodiment, the number of the plurality of sub-grids formed may be determined depending on a degree of uniformity of the distribution of the ion According to an example embodiment, the ion beam may be measured to obtain a two-dimensional distribution of the ion beam and/or form an extraction electrode consisting of a plurality of sub-grids having a two-dimensional shape corresponding to the distribution of the ion beam. The extraction electrode formed reflecting the ion beam distribution may be attached to an apparatus for controlling the ion beam and a desired, or alternatively, a proper potential may be applied to the plurality of sub-grids to improve the uniformity of the ion beam distribution.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
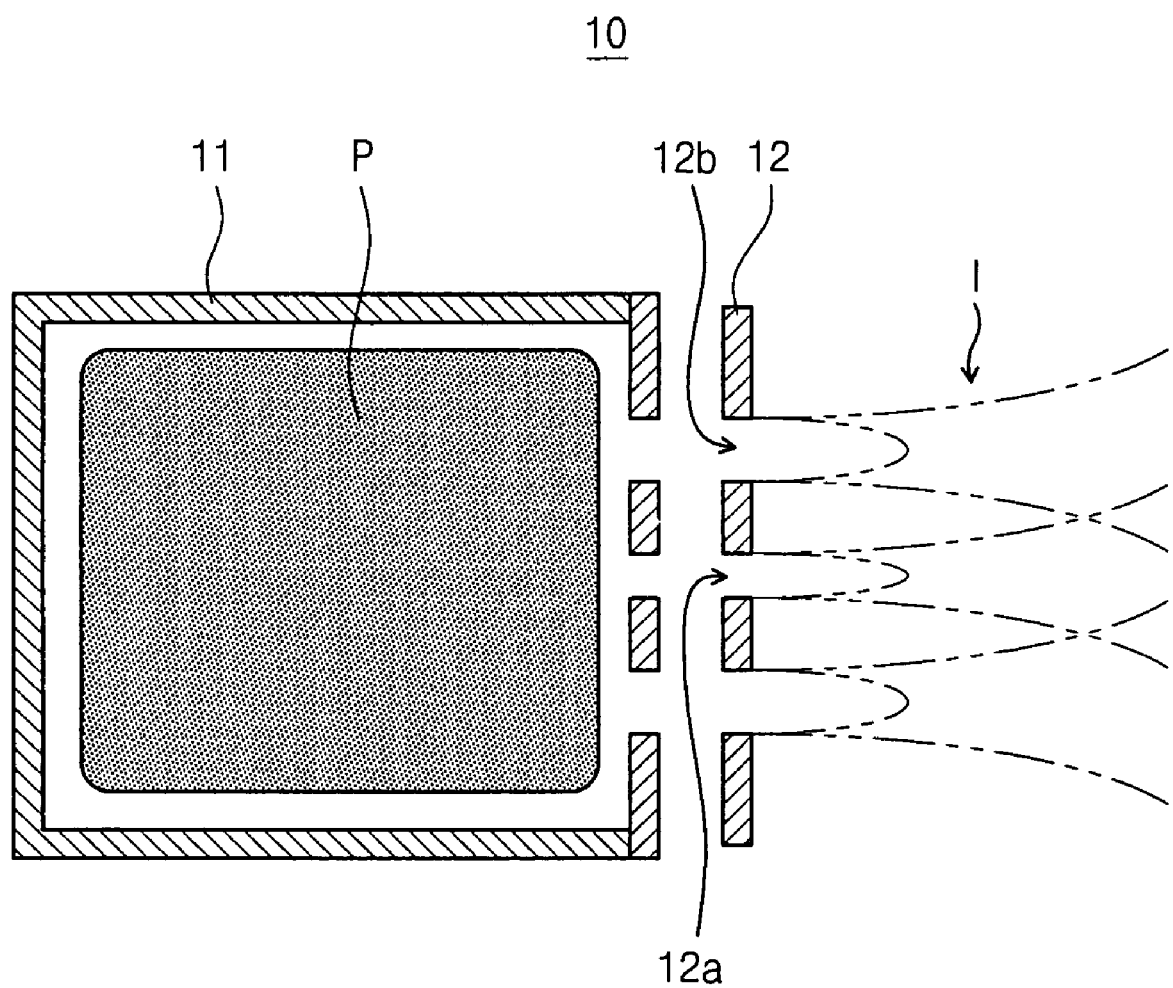
FIG. 1 is an ion beam apparatus according to the conventional art.

Example embodiments will now be described more fully hereinafter with reference to the accompanying drawings. Embodiments may, however, be in many different forms and should not be constructed as limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be also understood that, although the terms first, second, third, and the like may be used herein to describe various regions, voltages, and the like, these regions and voltages should not be limited by these terms. These terms are only used to distinguish one region and voltage from another region and voltage.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2A:
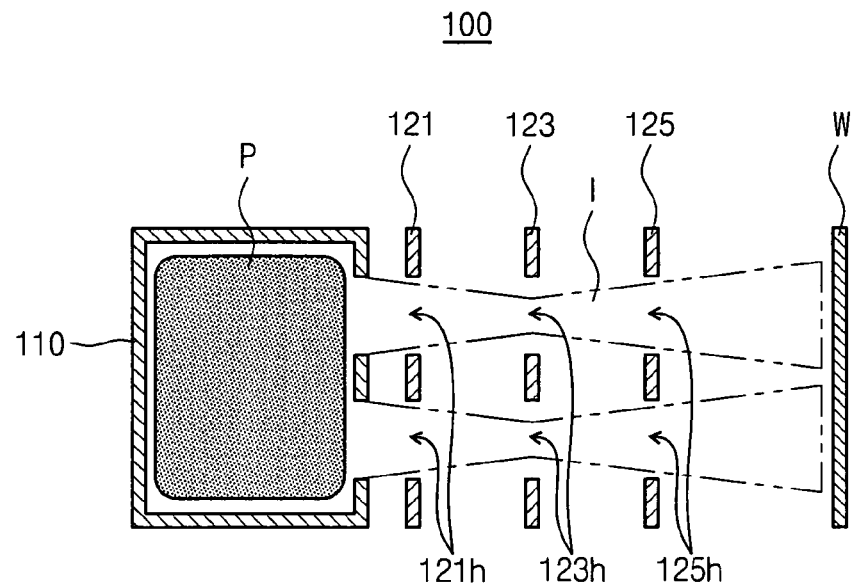
FIG. 2A is an apparatus for controlling an ion beam according to an example embodiment.

FIG. 2A illustrates an apparatus 100 for controlling an ion beam I according to an example embodiment.

Referring to FIG. 2A, the apparatus 100 for controlling the ion beam I may include an ion source P for generating the ion beam I and/or a plurality of extraction electrodes 121, 123, and/or 125 disposed in a path of the ion beam I extracted from the ion source P. The ion source P may include a plasma chamber 110. The extraction electrodes 121, 123, and 125 may have a plurality of extraction holes 121h, 123h, and/or 125h through which the ion beam I passes. The ion beam I passing through the extraction electrodes 121, 123, and 125 may head for a semiconductor substrate W. The ion source P may generate a plasma formed of ionized gas, and/or may extract ions from the ionized gas to generate the ion beam I. The plasma may be generated by electron cyclotron resonance (ECR), inductive coupling plasma (ICP), RF discharge, or the like. The gas to be used may be selected depending on process requirements.

An extraction electrode may extract and/or accelerate ions within a plasma. An extraction electrode may be a plurality of extraction electrodes. FIG. 2A illustrates first, second, and third extraction electrodes 121, 123, and 125. A first extraction electrode 121 may be an initial extraction electrode most adjacent to the ion source P. For example, the first extraction electrode 121 may constitute a part of the plasma chamber 110 of the ion source P. A negative potential may be applied to a second extraction electrode 123 spaced apart from the first extraction electrode 121 toward an opposite side of the ion source P. Accordingly, positive ions of the plasma generated within the ion source P may be accelerated and/or extracted from the ion source P to form the ion beam I. A third extraction electrode 125 may be a final extraction electrode spaced farthest from the ion source P among the plurality of extraction electrodes. A ground potential may be applied to the third extraction electrode 125 and/or a positive potential may be applied to the first extraction electrode 121. Additionally, other extraction electrodes to which a negative potential is applied may be disposed between the second and third extraction electrodes 123 and 125.

Figure 2B:
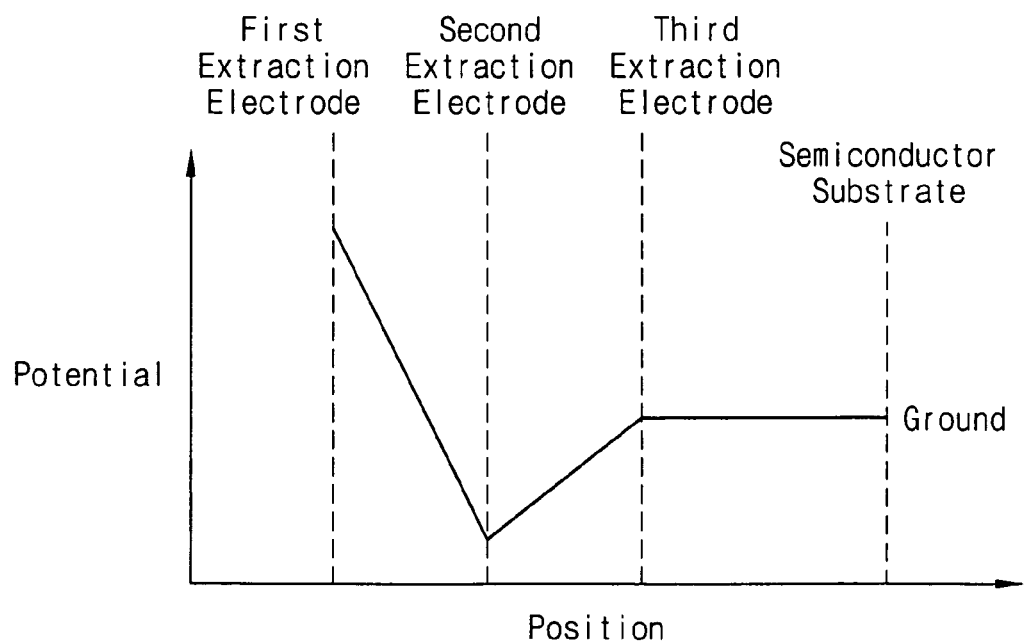
FIG. 2B is an example potential diagram according to a position of extraction electrodes of an apparatus for controlling an ion beam according to an example embodiment.

FIG. 2B is an example potential diagram according to a position of extraction electrodes of an apparatus 100 for controlling the ion beam I according to an example embodiment. Energy of the ion beam I to be extracted may be determined depending on the magnitude of a positive potential applied to the first extraction electrode 121. The energy may increase in proportion to the magnitude of the potential, and for example, a potential of a range from several through several tens of MV may be applied. A flux of the ion beam I to be extracted may be determined depending on a negative potential applied to the second extraction electrode 123. An irradiation angle of the ion beam I passing through the extraction holes 123h may be changed by controlling a potential applied to the second extraction electrode 123. The grounded third extraction electrode 125 may allow the ion beam I passing through the first and second extraction electrodes 121 and 123 to pass through a flat electric field incident to the grounded semiconductor substrate W without energy conversion.

In order to control ion beam distribution, at least one extraction electrode among the plurality of extraction electrodes may include a plurality of sub-grids to which different potentials may be applied. Hereinafter, an extraction electrode having a plurality of sub-grids is referred to as a beam controlling extraction electrode. A construction and/or a geometry of the plurality of sub-grids may be determined depending on the uniformity of the ion beam I extracted from the ion source P. If a flux of the ion beam I is small in a region on the semiconductor wafer W, a higher voltage may be applied to a sub-grid corresponding to the region to force the flux of the ion beam I into the region. Accordingly, a divergence of the ion beam I may be suppressed and/or the uniformity of the ion beam I may be improved. Physical factors related to control of the ion beam I may be energy, a flux, an irradiation angle, etc.

Beam controlling extraction electrodes according to example embodiments will now be described.

Figure 3:
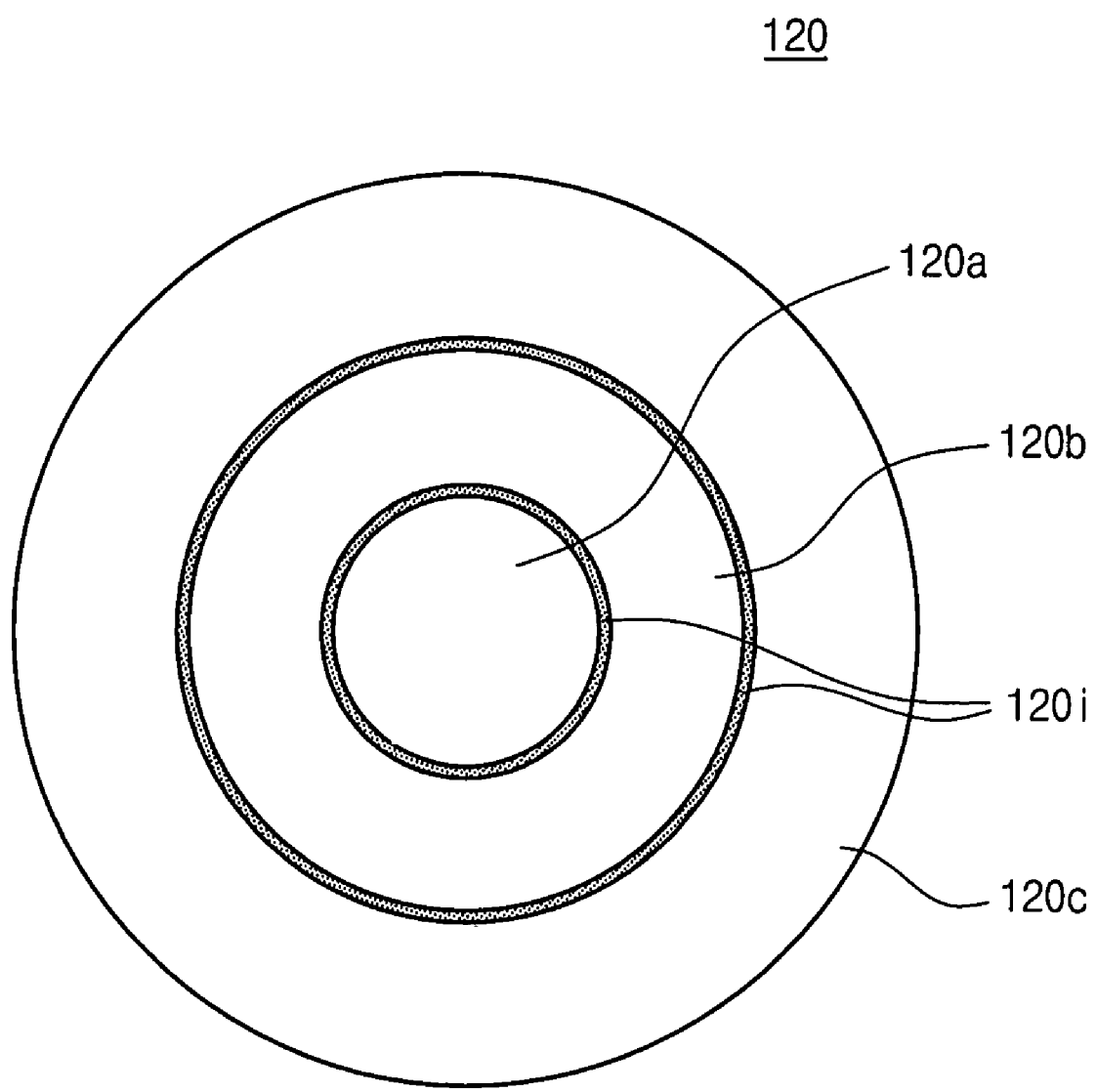
FIG. 3 is a view of an ion beam controlling extraction electrode according to an example embodiment.

FIG. 3 is an illustration of a beam controlling extraction electrode 120 according to an example embodiment. Illustration of extraction holes is omitted. It may be considered an optimal example case when the ion beam I extracted from the ion source P changes from a center of the ion beam I to an edge of the ion beam I. Referring to FIG. 3, the beam controlling extraction electrode 120 may be divided into a plurality of sub-grids 120a, 120b and/or 120c. The plurality of sub-grids may be a first sub-grid 120a located at a center of the beam controlling extraction electrode 120, a second sub-grid 120b outside the first sub-grid 120a, and/or a third sub-grid 120c outside the second sub-grid 120b. The first sub-grid 120a may be formed of a circular plate, the second sub-grid 120b may be formed of a plate having an inside diameter equal to or greater than an external diameter of the first sub-grid 120a, and/or the third sub-grid 120c may be formed of a plate having an inside diameter equal to or greater than an external diameter of the second sub-grid 120b. For example, the first, second, and third sub-grids 120a, 120b, and 120c may be disposed in a radial shape. Insulating materials 120i may be interposed between the plurality of sub-grids so different potentials may be applied to the plurality of sub-grids.

When energy or a flux of the ion beam I decreases from a center of the ion beam I toward an edge of the ion beam I, a higher potential may be applied to the second and/or third sub-grids 120b and/or 120c than the first sub-grid 120a. Accordingly, the energy or the flux of the ion beam I may increase in the edge of the ion beam I to improve the uniformity of the ion beam I.

Figure 4:
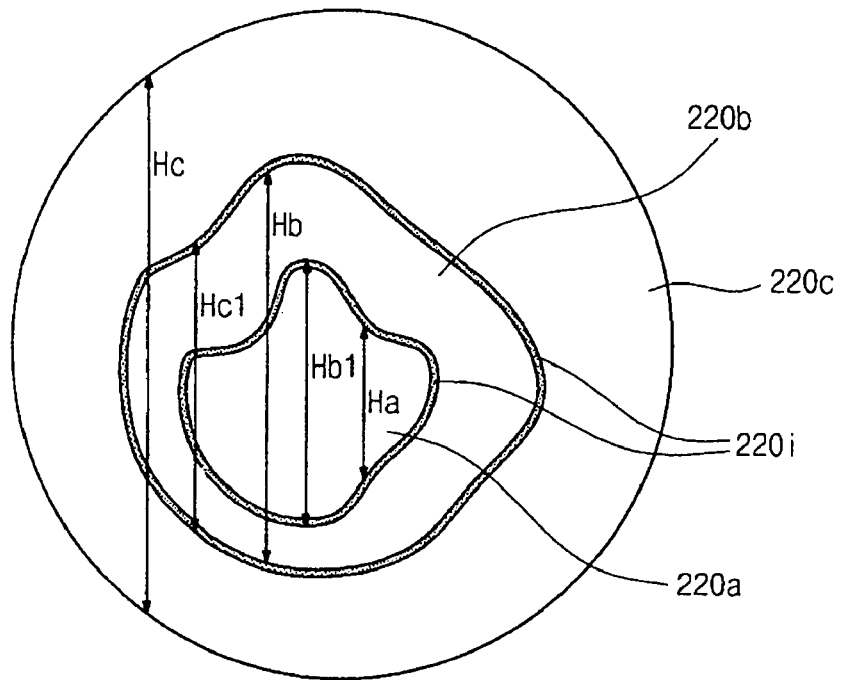
FIG. 4 is a view of an ion beam controlling extraction electrode according to another example embodiment.
Figure 5:
FIG. 5 illustrates ion beam distribution according to an example embodiment measured on a semiconductor substrate.

FIG. 4 is an illustration of a beam controlling extraction electrode 220 according to another example embodiment. Illustration of extraction holes is omitted. Referring to FIG. 4, the beam controlling extraction electrode 220 may be divided into a plurality of sub-grids 220a, 220b and/or 220c. The plurality of sub-grids may be a first sub-grid 220a located in the beam controlling extraction electrode 120, a second sub-grid 220b outside the first sub-grid 220a, and/or a third sub-grid 220c outside the second sub-grid 220b. The sub-grid 220a may have an external variable height Ha, the sub-grid 220b may have an inside variable height Hb1 and/or an external variable height Hb, and the sub-grid 220c may have an inside variable height Hc1 and/or an external variable height Hc. The first sub-grid 220a may be formed of a plate having a desired shape, or alternatively, a shape reflecting an actual ion beam distribution, the second sub-grid 220b may be formed of a plate having an inside variable height Hb1 equal to or greater than an external variable height Ha of the first sub-grid 220a, and/or the third sub-grid 220c may be formed of a plate having an inside variable height Hc1 equal to or greater than an external variable height Hb of the second sub-grid 220b. Insulating materials 220i may be interposed between the plurality of sub-grids so different potentials may be applied to the plurality of sub-grids. FIG. 5 illustrates an ion beam distribution according to an example embodiment measured on a semiconductor substrate. Referring to FIG. 4, the plurality of sub-grids constituting a beam controlling extraction electrode may have a construction reflecting the practical ion beam distribution, for example an actual ion beam distribution, as illustrated in FIG. 5.

Figure 6:
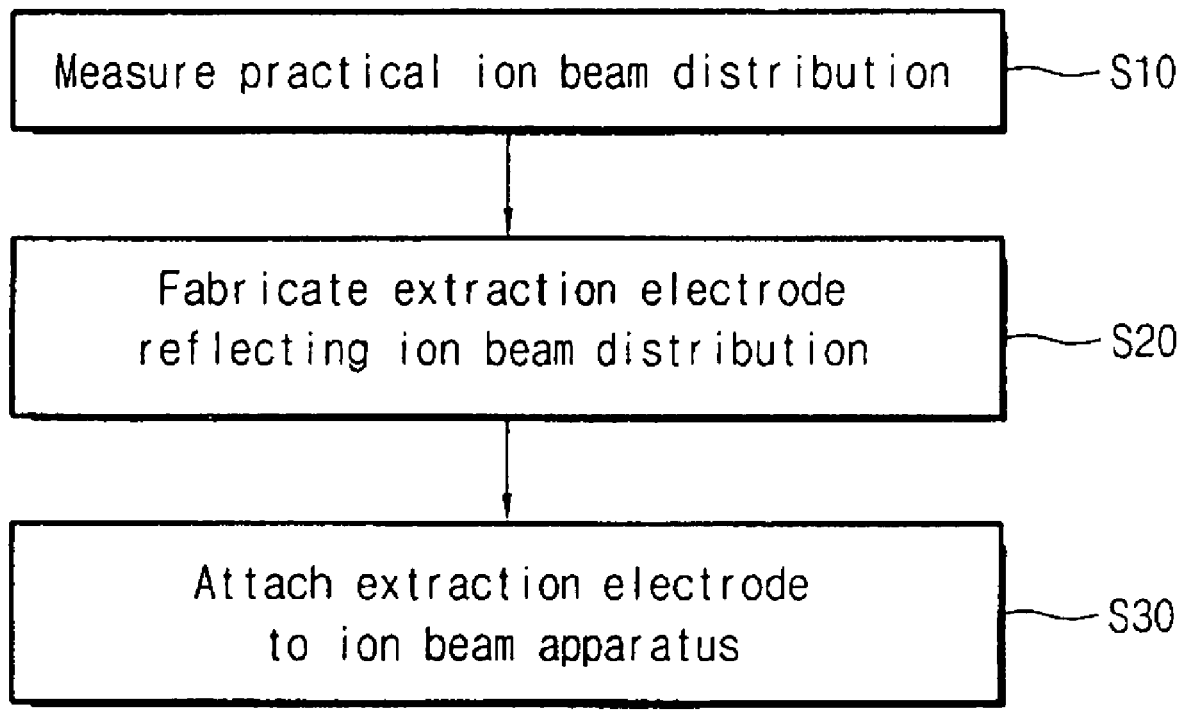
FIG. 6 is a flow chart for illustrating a method for preparing a beam controlling extraction electrode according to an example embodiment.

Hereinafter, a method for preparing an extraction electrode having a construction reflecting an actual ion beam distribution according to an example embodiment will be described. FIG. 6 is a flow chart for illustrating a method for preparing a beam controlling extraction electrode according to example embodiments. Practical ion beam distribution, for example an actual ion beam distribution, may be obtained by measuring an ion beam on a semiconductor substrate without an extraction electrode of example embodiments. The measured physical factor may be energy, a flux, or an irradiation angle of the ion beam. A two-dimensional distribution of the ion beam, for example as illustrated in FIG. 5, may be measured (S10). A semiconductor substrate may be divided into a plurality of regions having a two-dimensional configuration reflecting the distribution of the ion beam. A plurality of sub-grids corresponding to the regions may be formed and/or may be combined with one another, and/or insulating materials 220*i* may be interposed between the plurality of sub-grids to form the beam controlling extraction electrode (S20), for example as illustrated in FIG. 4. The number of the plurality of sub-grids may be determined depending on a degree of the uniformity of the distribution of the ion beam.

The beam controlling extraction electrode, which may be fabricated to have a construction reflecting the practical ion beam distribution, for example an actual ion beam distribution, may be attached to an apparatus for controlling an ion beam (S30) and/or a desired, or alternatively, a proper potential may be applied to the plurality of sub-grids. Accordingly, the ion beam may have more uniform distribution.

The beam controlling extraction electrode may depend on a target to be controlled. In order to control the uniformity of energy of the ion beam, the beam controlling extraction electrode may be a first extraction electrode most adjacent to an ion source. For example, positive potentials applied to the first extraction electrode may be independently applied to a plurality of sub-grids, respectively. In order to control a flux of the ion beam, the beam controlling extraction electrode may be the second extraction electrode, which may be an extraction electrode spaced from a first extraction electrode most adjacent to the ion source and/or located between the first extraction electrode and a final extraction electrode. For example, the plurality of sub-grids may be disposed in the extraction electrode to which negative potentials may be applied and/or desired, or alternatively, proper potentials may be independently applied to the sub-grids, respectively. Accordingly, the flux of the ion beam may become more uniform on the semiconductor substrate and/or an irradiation angle passing through extraction holes may be controlled.

The ion beam extracted from the apparatus for controlling an ion beam of example embodiments may be used in a process for the semiconductor device. The ion beam itself may be irradiated to a surface of the semiconductor substrate. Alternatively, another beam derived from the ion beam may be irradiated by additionally disposing another apparatus between the apparatus for controlling the ion beam and the semiconductor substrate. For example, an ion implantation apparatus for implanting impurities into the surface of the semiconductor substrate or a dry etching apparatus for dry etching of the surface of the semiconductor substrate may be additionally disposed. In the case of the ion implantation apparatus, an ion beam of arsenic (As), boron (B), phosphorus (P), germanium (Ge), or the like may be irradiated, and in the case of the dry etching apparatus, an ion beam of fluorine (F), chlorine (Cl), argon (Ar), or the like may be irradiated. A plasma of the ion source may be selected to correspond to a kind of the ions.

The ion beam may be converted into a neutral beam through a neutralization process. The neutral beam may be irradiated to a surface of the semiconductor substrate. The ion beam may be applied to form a pattern on the surface of the semiconductor substrate. When an electron beam is desired instead of the ion beam to form a pattern, the positive and negative polarities of the potentials may be reversed in the aforementioned apparatus because charged particles constituting the electron beam may be electrons.

According to example embodiments, a voltage applied to each sub-grid of the extraction electrode may be controlled to improve the uniformity of the ion beam or the neutral beam used in processing the semiconductor substrate. For example, the uniformity of the ion beam may be more easily controlled by separating energy, a flux, and/or an irradiation angle of the ion beam. Control of the uniformity of the ion beam may be done without changing the ion beam apparatus, for example, without controlling a non-uniform plasma. Accordingly, because the uniformity may increase in a semiconductor process, the reliability of the semiconductor device may be improved and/or a process window may be enlarged.

Although example embodiments have been shown and described in this specification and figures, it would be appreciated by those skilled in the art that changes may be made to the illustrated and/or described example embodiments without departing from their principles and spirit, the scope of which is defined by the claims and their equivalents.

What is claimed is:

1. An apparatus for controlling an ion beam, comprising:
   a plurality of extraction electrodes disposed in a path of an ion beam, the plurality of extraction electrodes accelerating ions,
   wherein at least one extraction electrode, being most adjacent to an ion source among the plurality of extraction electrodes, includes a plurality of sub-electrodes.

2. The apparatus of claim 1, wherein the remainder of the plurality of extraction electrodes are extraction electrodes including a plurality of sub-electrodes.

3. The apparatus of claim 1, wherein the remainder of the plurality of extraction electrodes are extraction electrodes without a plurality of sub-electrodes.

4. The apparatus of claim 1, wherein some of the remainder of the plurality of extraction electrodes include a plurality of sub-electrodes and some of the remainder of the plurality of extraction electrodes do not include a plurality of sub-electrodes.

5. The apparatus of claim 1, wherein potentials are applied to the plurality of sub-electrodes to control the ion beam.

6. The apparatus of claim 1, further comprising:
   an ion source for generating the ion beam,
   wherein the plurality of extraction electrodes includes a plurality of extraction holes through which the ion beam passes.

7. The apparatus of claim 1, wherein the plurality of sub-electrodes include
   a first sub-electrode in the at least one extraction electrode; and
   a second sub-electrode outside the first sub-electrode and having a potential difference with respect to the first sub-electrode.

8. The apparatus of claim 7, further comprising:
an insulating material between the first sub-electrode and the second sub-electrode.

9. The apparatus of claim 7, wherein the first sub-electrode is a circular plate at the center of the at least one extraction electrode, and the second sub-electrode is a plate having an inside diameter equal to or greater than an external diameter of the first sub-electrode.

10. The apparatus of claim 1, wherein a ground potential is applied to a final extraction electrode spaced farthest from the ion source among the plurality of extraction electrodes.

11. The apparatus of claim 1, wherein the plurality of sub-electrodes have a configuration reflecting an actual ion beam distribution.

12. An apparatus for controlling an ion beam, comprising:
a plurality of extraction electrodes disposed in a path of an ion beam, the plurality of extraction electrodes accelerating ions,
wherein at least one extraction electrode, being spaced from a first extraction electrode most adjacent to an ion source and being located between the first extraction electrode and a final extraction electrode, includes a plurality of sub-electrodes.

13. The apparatus of claim 12, wherein the at least one extraction electrode has a different potential from the first extraction electrode.

14. The apparatus of claim 13, wherein a positive potential is applied to the first extraction electrode and a negative potential is applied to the at least one extraction electrode.

15. A method for controlling an ion beam, the method comprising:
applying a potential to a plurality of extraction electrodes disposed in a path of an ion beam, the plurality of extraction electrodes accelerating ions, wherein at least one extraction electrode, being most adjacent to an ion source among the plurality of extraction electrodes, includes a plurality of sub-electrodes.

16. The method of claim 15, wherein the remainder of the plurality of extraction electrodes are extraction electrodes including a plurality of sub-electrodes.

17. The method of claim 15, wherein the remainder of the plurality of extraction electrodes are extraction electrodes without a plurality of sub-electrodes.

18. The method of claim 15, wherein some of the remainder of the plurality of extraction electrodes include a plurality of sub-electrodes and some of the remainder of the plurality of extraction electrodes do not include a plurality of sub-electrodes.

19. The method of claim 15, further comprising:
independently controlling potentials of the plurality of sub-electrodes.

20. The method of claim 19, wherein the potentials of the plurality of sub-electrodes are independently controlled to control a flux, or an irradiation angle of the ion beam.

21. The method of claim 15, wherein the plurality of sub-electrodes are electrically insulated from one another.

22. The method of claim 15, wherein a ground potential is applied to a final extraction electrode spaced farthest from the ion source among the plurality of extraction electrodes.

23. The method of claim 15, wherein the plurality of sub-electrodes have a configuration reflecting an actual ion beam distribution.

24. A method for controlling an ion beam, the method comprising:
applying a potential to a plurality of extraction electrodes disposed in a path of an ion beam, the plurality of extraction electrodes accelerating ions,
wherein at least one extraction electrode, being spaced from a first extraction electrode most adjacent to an Ion source and being located between the first extraction electrode and a final extraction electrode, includes a plurality of sub-electrodes.

25. The method of claim 24, wherein a positive potential is applied to the first extraction electrode and a negative potential is applied to the at least one extraction electrode.

26. A method for preparing an extraction electrode, the method comprising:
measuring a distribution of an ion beam; and
forming at least one extraction electrode, of a plurality of extraction electrodes, having a plurality of sub-electrodes having a configuration reflecting the distribution of the ion beam,
wherein the plurality of extraction electrodes accelerate ions.

27. The method of claim 26, wherein measuring the distribution of the ion beam measures a two-dimensional distribution of the ion beam on a semiconductor substrate, and
wherein forming the at least one extraction electrode further includes
dividing the semiconductor substrate into a plurality of regions having a two-dimensional configuration reflecting the two-dimensional distribution of the ion beam, and
forming the plurality of sub-electrodes to correspond to the plurality of regions.

28. The method of claim 26, wherein forming the at least one extraction electrode further includes
interposing insulating material between the plurality of sub-electrodes.

29. The method of claim 26, wherein measuring the distribution of the ion beam measures energy, a flux, or an irradiation angle of the ion beam.

30. The method of claim 26, wherein the number of sub-electrodes is a function of a degree of uniformity of the distribution of the ion beam.

* * * * *